US012120831B2

(12) United States Patent
Tsorng et al.

(10) Patent No.: US 12,120,831 B2
(45) Date of Patent: *Oct. 15, 2024

(54) RULER DEVICE MODULE

(71) Applicant: Quanta Computer Inc., Taoyuan (TW)

(72) Inventors: Yaw-Tzorng Tsorng, Taoyuan (TW); Tung-Hsien Wu, Taoyuan (TW); Yu-Ying Tseng, Taoyuan (TW); Hsiang-Pu Ni, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/344,270

(22) Filed: Jun. 29, 2023

(65) Prior Publication Data

US 2023/0345649 A1 Oct. 26, 2023

Related U.S. Application Data

(63) Continuation of application No. 17/550,819, filed on Dec. 14, 2021, now Pat. No. 11,737,221.

(51) Int. Cl.
*H05K 5/02* (2006.01)
*H05K 7/14* (2006.01)

(52) U.S. Cl.
CPC ......... *H05K 5/0213* (2013.01); *H05K 5/0221* (2013.01); *H05K 5/023* (2013.01); *H05K 7/1487* (2013.01)

(58) Field of Classification Search
None
See application file for complete search history.

(56) References Cited

U.S. PATENT DOCUMENTS

| | | | | |
|---|---|---|---|---|
| 5,277,615 A | * | 1/1994 | Hastings | G11B 33/126 |
| 5,673,172 A | * | 9/1997 | Hastings | H05K 7/1418 |
| | | | | 361/818 |
| 8,649,180 B2 | * | 2/2014 | Grady | G06F 1/183 |
| | | | | 361/725 |
| 9,532,480 B2 | | 12/2016 | Shen et al. | |
| 9,658,655 B2 | | 5/2017 | Yu | |
| 9,936,599 B1 | | 4/2018 | Shih et al. | |
| 10,168,747 B2 | | 1/2019 | Zhu et al. | |
| 11,058,025 B1 | | 7/2021 | Cheng | |
| 2012/0025680 A1 | | 2/2012 | Lu | |
| 2015/0195946 A1 | | 7/2015 | Kelaher et al. | |
| 2019/0016398 A1 | | 1/2019 | Hartman et al. | |
| 2021/0298192 A1 | | 9/2021 | Peng et al. | |
| 2021/0368645 A1 | | 11/2021 | Li et al. | |

* cited by examiner

*Primary Examiner* — James Wu
*Assistant Examiner* — Christopher L Augustin
(74) *Attorney, Agent, or Firm* — NIXON PEABODY LLP

(57) ABSTRACT

A ruler device module is disclosed that includes top and bottom plates that are parallel, with the bottom plate defining a tray where the bottom plate extends beyond the top plate. The module further includes a pair of side plates on opposite sides of, and extending between, the top and bottom plate, with each side plate including a slot. Partitions are perpendicular to and between the top and bottom plates forming bays between adjacent partitions and the top and bottom plates. A handle structure is between the top and bottom plates and includes a handle configured to rotate between a recessed position and a use position. A nut structure is between the top plate and the bottom plate. The nut structure includes an aperture configured to engage a fastener of a chassis to secure the ruler device module to the chassis.

17 Claims, 13 Drawing Sheets

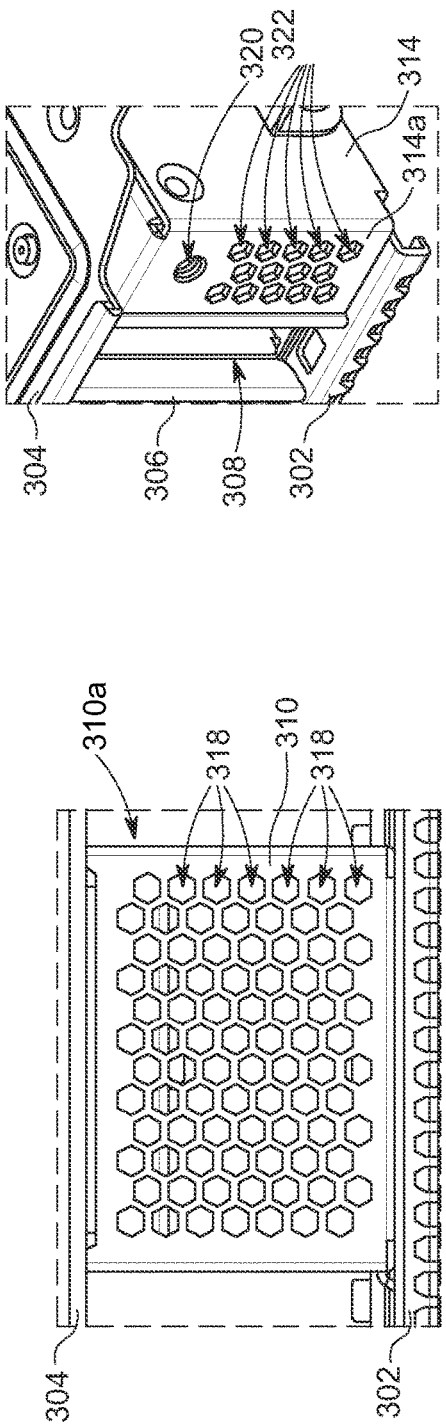
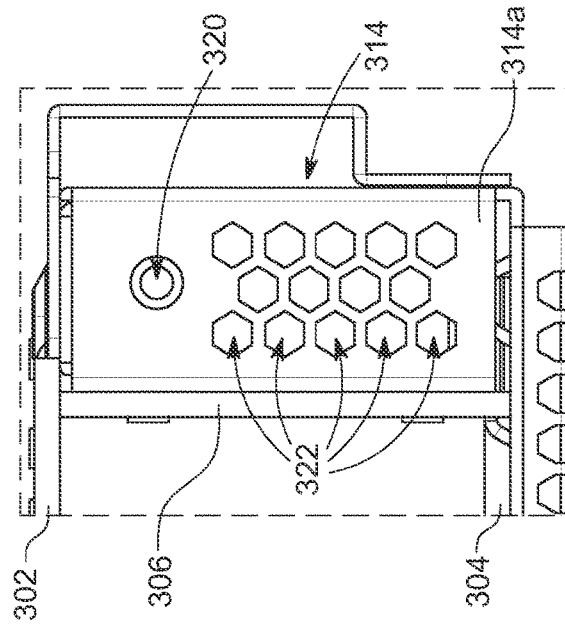
FIG. 3B
FIG. 3C
FIG. 3D

RULER DEVICE MODULE

CROSS-REFERENCE TO RELATED APPLICATIONS

This application is a continuation of U.S. patent application Ser. No. 17/550,819, filed Dec. 14, 2021, now allowed, which is incorporated herein by reference in its entirety.

FIELD OF THE INVENTION

The present invention relates generally to the chassis of a computing system, and more specifically, to a module that can be added to the chassis of a computing system.

BACKGROUND OF THE INVENTION

The Enterprise and Data Center SSD Form Factor (ED-SFF) is a new form factor being implemented in computing systems, and more specifically server computing systems. Devices designed according to the EDSFF, also known as ruler devices, are inserted into an EDSFF bracket (also referred to as "ruler device bracket") fixed to the front of a chassis of a computing system. The ruler device bracket mates with a board (main board (motherboard), daughter board, etc.) behind it to connect the ruler device bracket with the rest of the internal components of the computing system. The conventional ruler device bracket has the disadvantage of a limited space configuration limitation. For example, the conventional ruler device bracket needs to be configured with a degree of misplacement with the main board to avoid affecting the operational and supported functional diversity of the main board. This requires that the chassis of the computing system is a certain length, which is longer than conventional computing systems without the conventional ruler device bracket.

FIG. 1 shows a perspective view of a chassis 102 of a computing system 100. The chassis 102 includes a front window 104 and a rear window 106. As shown in the detailed portion of FIG. 1, the front window 104 is more specifically the front window of a conventional ruler device bracket 108. Ruler devices 110 can be inserted into and removed from the front window 104 of the conventional ruler device bracket 108 to connect to the computing system 100.

FIG. 2 shows a cross-sectional view of the chassis 102 of the computing system 100 of FIG. 1, with the ruler devices 110 inserted into the conventional ruler device bracket 108. The length D1 of the chassis 102 is generally about 780 millimeters (mm). However, the length D2 of the conventional ruler device bracket 108 accounts for part of the length D1. In other words, having the conventional ruler device bracket 108 connected to the chassis 102 takes up additional space (i.e., length D2), which is detrimental to the overall use of the chassis 102 of the computing system 100.

Further, the computing system 100 includes a main board 200 that is horizontally offset (in the orientation of FIG. 2) from the conventional ruler device bracket 108. Thus, there is a considerable amount of unused space within the computing system 100, including the unused space 202 above the main board 200 and the unused spaces 204 and 206 above and below, respectively, the ruler devices 110 within the conventional ruler device bracket 108. The fixed ruler device bracket 108 further adds an amount of displacement with the main board 200 to avoid affecting the operational and supported functional diversity of the main board 200, which results in the space 208 between the conventional ruler device bracket 108 and the main board 200.

The present disclosure is directed to solving the above problems found in conventional computing systems with conventional ruler device brackets, such as the conventional computing system 100 of FIG. 1, by providing a ruler device module that provides for more efficient use of the space in computing systems that include connected ruler devices.

SUMMARY OF THE INVENTION

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to one embodiment of the present disclosure, a ruler device module is disclosed. The ruler device module includes a top plate and a bottom plate parallel to the top plate. The bottom plate extends beyond the top plate in one direction. The bottom plate defines a tray where the bottom plate extends beyond the top plate. The ruler device module further includes a pair of side plates on opposite sides of, and extending between, the top plate and the bottom plate. Each side plate includes a slot. The ruler device module further includes partitions perpendicular to and between the top plate and the bottom plate forming bays between adjacent partitions and between the top plate and the bottom plate. Each bay is configured to retain a ruler device. The ruler device module further includes a handle structure between the top plate and the bottom plate. The handle structure includes a handle configured to rotate between a recessed position, in which the handle is recessed between the top plate and the bottom plate, and a use position, in which the handle extends perpendicular to the top plate. The ruler device module further includes a nut structure between the top plate and the bottom plate. The nut structure includes an aperture configured to engage a fastener of a chassis to secure the ruler device module to the chassis.

According to one aspect of the above embodiment, the handle structure includes apertures configured to permit airflow to pass through the handle structure. According to another aspect of the above embodiment, the apertures are in the shape of a hexagon. According to another aspect of the above embodiment, the nut structure includes apertures configured to permit airflow to pass through the nut structure. According to another aspect of the above embodiment, the apertures are in the shape of a hexagon. According to another aspect of the above embodiment, the tray includes a plurality of posts for coupling a board to the tray. According to another aspect of the above embodiment, the slot includes an open portion and a slot portion.

According to another embodiment of the present disclosure, a computing system is disclosed. The computer system includes a chassis. The chassis includes two side plates, and a front window and a rear window at opposite ends of the two side plates. The chassis further includes two pins, with each pin extending from a separate one of the two side plates and at the front window. The chassis further includes a fastener. The computing system further includes a main board housed within the chassis and a ruler device module. The ruler device module includes a top plate and a bottom plate parallel to the top plate and extending beyond the top plate in one direction. The bottom plate defines a tray where the bottom plate extends beyond the top plate. The ruler device module further includes a pair of side plates on opposite sides of, and extending between, the top plate and the bottom plate. Each side plate includes a slot that is configured to engage with one of the two pins. The ruler device module further includes partitions perpendicular to and between the top plate and the bottom plate forming bays between adjacent partitions and between the top plate and the bottom plate. Each bay is configured to retain a ruler device. The ruler device module further includes a handle structure recessed within the top plate. The handle structure includes a handle configured to rotate between a recessed position, in which the handle is recessed within the top plate, and a use position, in which the handle extends perpendicular to the top plate, for removing and inserting the ruler device module from the chassis. The ruler device module further includes a nut structure. The nut structure includes an aperture configured to engage the fastener to secure the ruler device module to the chassis. The computing system further includes a daughter board coupled to the ruler device on the tray. The daughter board is configured to connect the ruler device module to the main board.

According to one aspect of the above embodiment, the handle structure includes apertures configured to permit airflow to pass through the handle structure. According to another aspect of the above embodiment, the nut structure includes apertures configured to permit airflow to pass through the nut structure. According to another aspect of the above embodiment, the tray includes a plurality of posts upon which the daughter board sits for coupling the daughter board to the tray. According to another aspect of the above embodiment, the fastener is a thumb screw. According to another aspect of the above embodiment, the ruler device module overlaps the main board within the chassis. According to another aspect of the above embodiment, the slot includes an open portion and a slot portion, and the pins sit in the slot portions with the ruler device secured to the chassis. According to another aspect of the above embodiment, the open portion faces the chassis so that the ruler device module can be lowered into the chassis to place the ruler device module into the chassis. According to another aspect of the above embodiment, the handle structure is recessed between the top plate and the bottom plate. According to another aspect of the above embodiment, the nut structure is between the top plate and the bottom plate. According to another aspect of the above embodiment, the nut structure includes a first nut structure at one side of the top plate and the bottom plate. The nut structure further includes a second nut structure at an opposing side of the top plate and the bottom plate. The first and second nut structures are adjacent to the pair of side plates, and the fastener includes a first fastener and a second fastener. According to another aspect of the above embodiment, the ruler device module fits recessed within the chassis. According to another aspect of the above embodiment, the chassis is 580 mm long.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments, and are therefore not to be considered as limitations on the scope of the various embodiments or claims.

FIG. 3B shows a front side view of a handle structure within a ruler device module, according to an embodiment of the present disclosure.

FIG. 3C shows a perspective view of a nut structure within a ruler device module, according to an embodiment of the present disclosure.

FIG. 3D shows a front side view of a nut structure within a ruler device module, according to an embodiment of the present disclosure.

Figure 1:
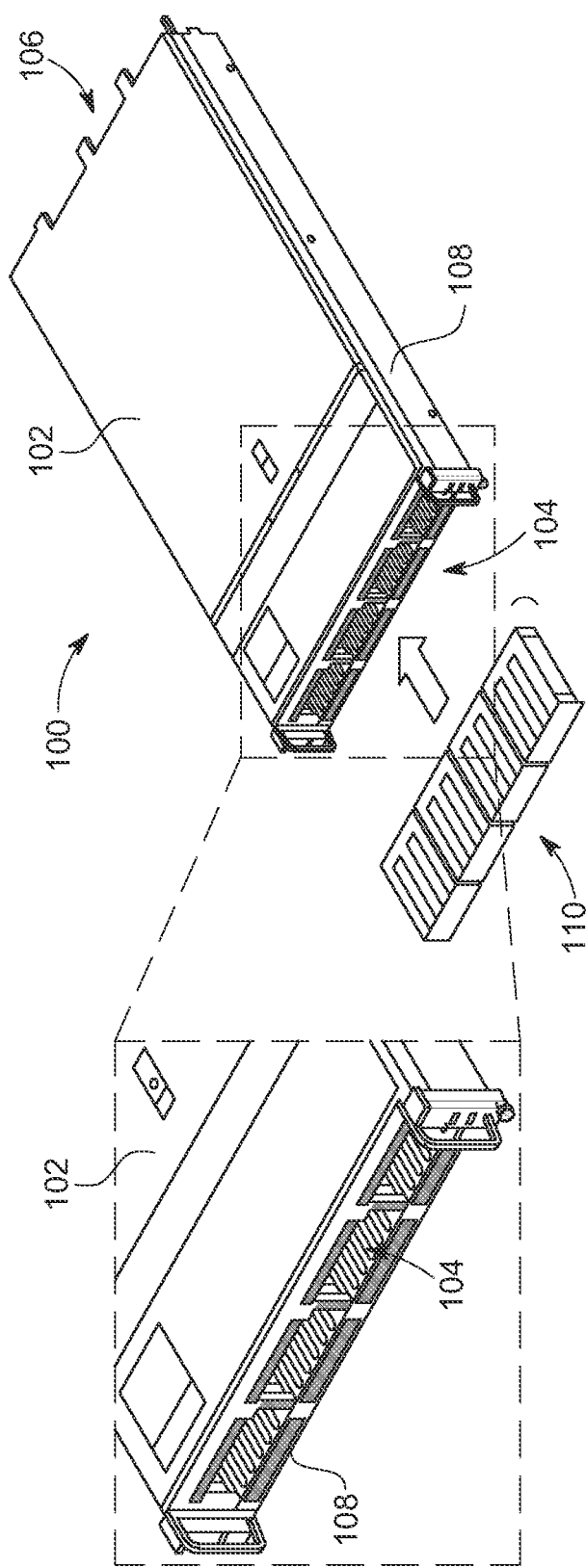
FIG. 1 shows a perspective view of a conventional computing system.

While the invention is susceptible to various modifications and alternative forms, specific embodiments have been shown by way of example in the drawings and will be described in further detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Various embodiments are described with reference to the attached figures, where like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," "generally," and the like, can be used herein to mean "at," "near," or "nearly at," or "within 3-5% of," or "within acceptable manufacturing tolerances," or any logical combination thereof, for example.

Figure 3A:
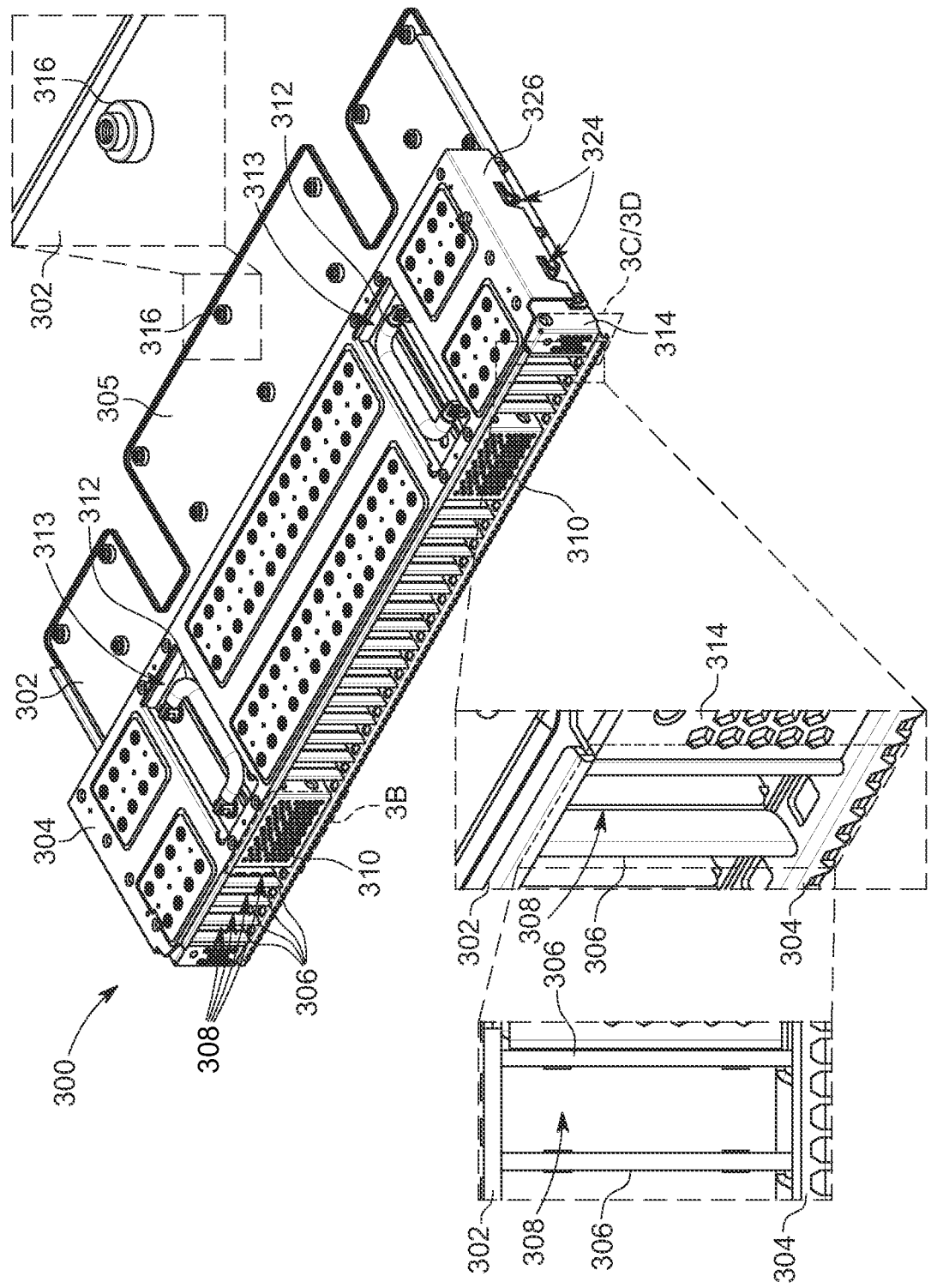
FIG. 3A shows a front perspective view of a ruler device module, according to an embodiment of the present disclosure.
Figure 6:
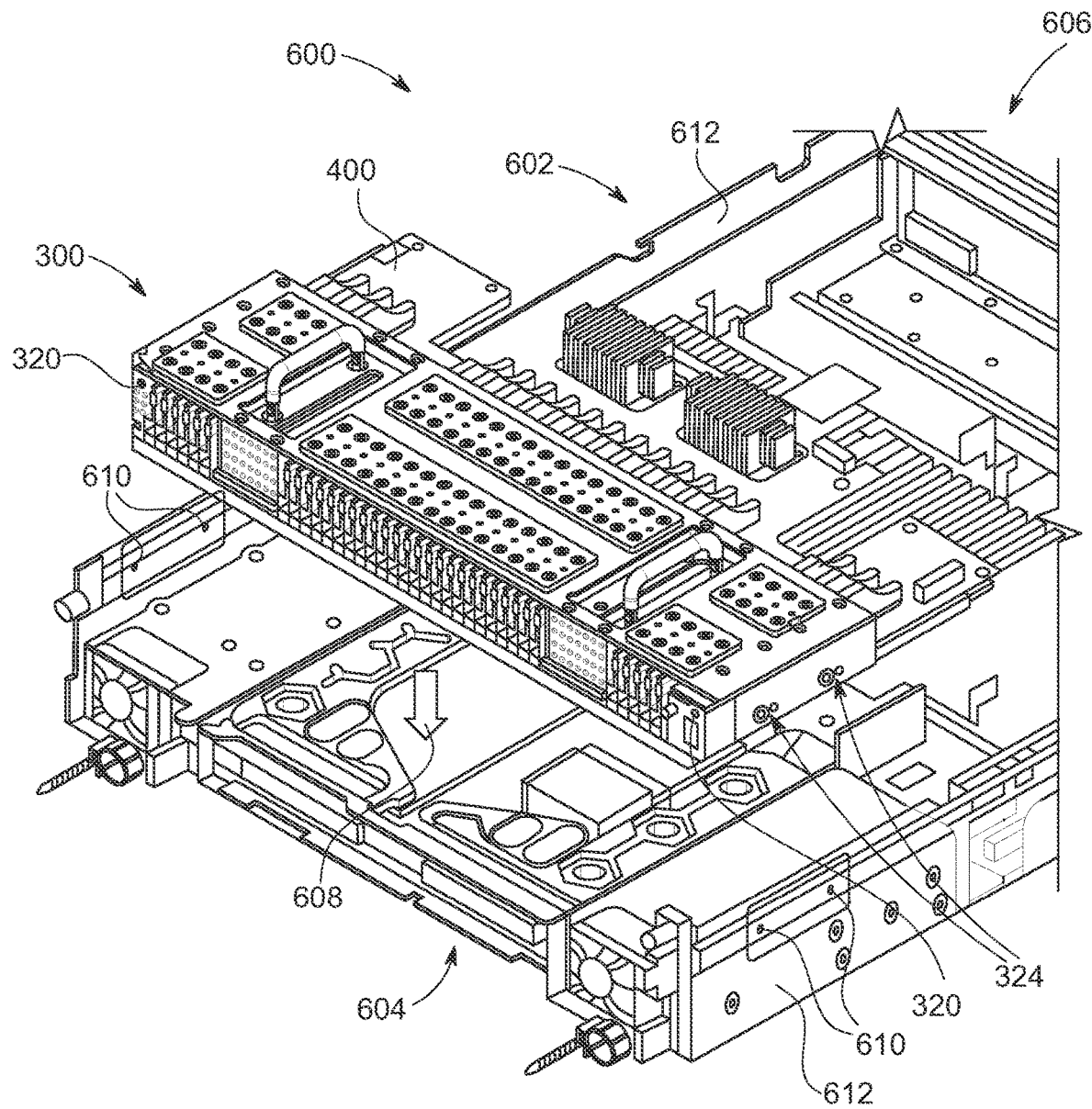
FIG. 6 shows a perspective view of a ruler device module being inserted into a chassis of a computing system, according to an embodiment of the present disclosure.

FIG. 3A shows a front perspective view of a ruler device module 300, according to an embodiment of the present disclosure. The ruler device module 300 is formed of a base plate 302 and a top plate 304. The base plate 302 and the top plate 304 can be formed of any material typically used in the construction of computing systems, such as sheet metal or metal alloy or a hard plastic. The base plate 302 extends beyond the top plate 304 to form a tray 305, for reasons discussed below with respect to FIG. 4. The base plate 302 and the top plate 304 are generally parallel to each other and extend horizontally in the orientation shown in FIG. 3A and as used within a computer system (FIG. 6).

As shown throughout, but also specifically in the detailed portions at the bottom left of FIG. 3A, extending generally vertically between the generally horizontal base plate 302 and top plate 304 are partitions 306. The partitions 306 can similarly be formed of any material typically used in the construction of computing systems, such as sheet metal or metal alloy or a hard plastic. The partitions 306 are generally parallel to each other. The partitions 306 form bays 308 between adjacent partitions 306 and between the base plate 302 and the top plate 304. As discussed with respect to FIG. 5 below, the bays 308 are configured (e.g., sized) to accept ruler devices. The bottom-left detailed view is a front view that shows the vertical partitions 306 forming a bay 308 between the base plate 302 and the top plate 304.

Also between the base plate 302 and the top plate 304 are two handle structures 310. Each handle structure 310 includes a handle 312 that extends through an opening 313 in the top plate 304. As shown in FIG. 3A, the handle 312 can be recessed within the handle structure 310 when not in use so as to be below the top plate 304. In this position, the handle 312 does not obstruct the ruler device module 300 from being inserted into the chassis of a computing system (FIG. 6). When in use, the handle 312 can be rotated generally 90 degrees to permit a user to withdraw the ruler device module 300 from a computing system (FIG. 6). The handle structures 310 are generally hollow to permit airflow through the ruler device module 300. However, in one or more embodiments, the handle structure 310 can house a component, such as a fan module or a power supply unit.

Figure 10:
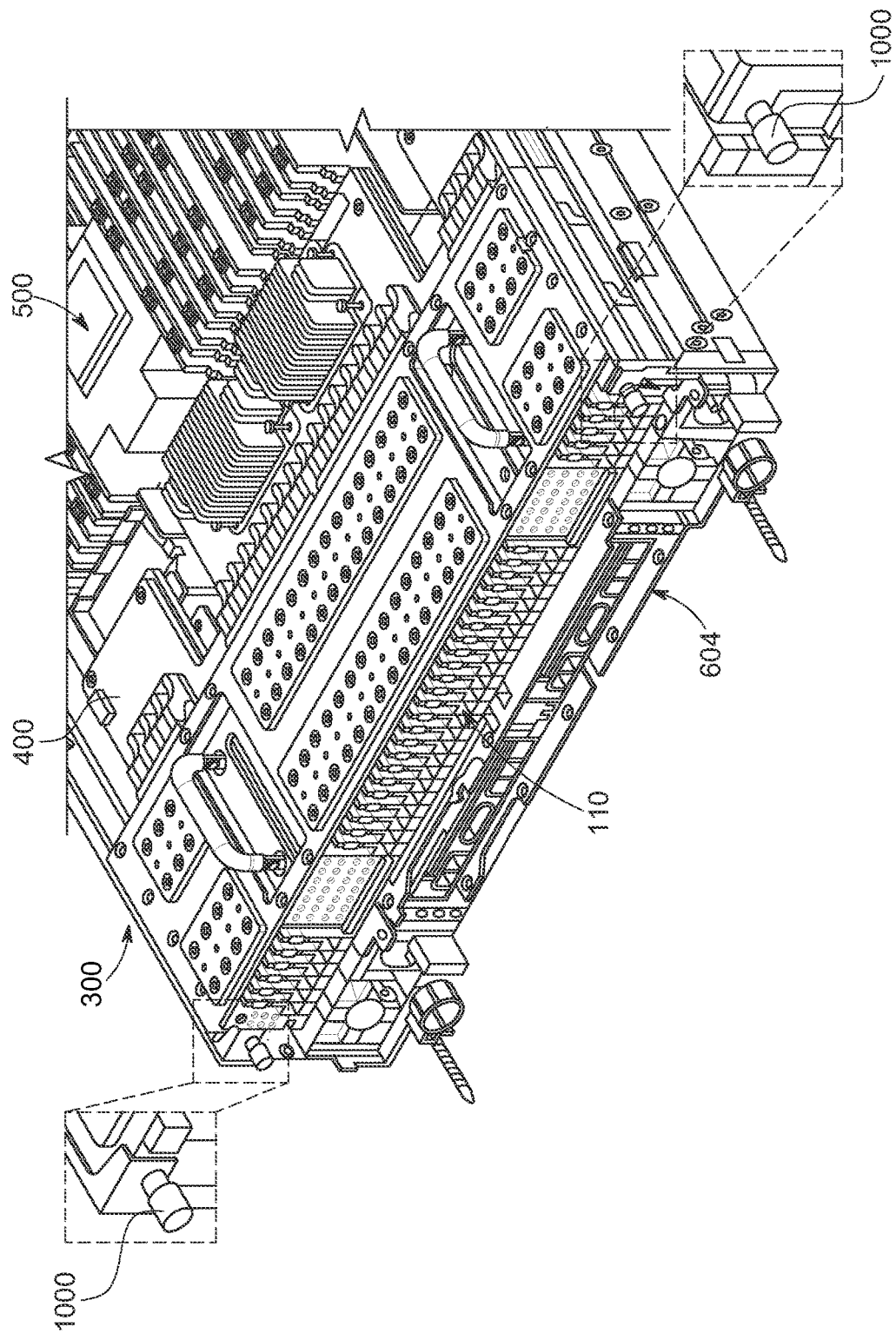
FIG. 10 shows a perspective view of a ruler device module secured to a chassis of a computing system, according to an embodiment of the present disclosure.

Also between the base plate 302 and the top plate 304 are two nut structures 314. The nut structures 314 can further provide airflow through the ruler device module 300. The nut structures 314 also accept a bolt or other similar fastener for securing the ruler device module 300 within a chassis of a computing system (FIG. 10).

Referring to the top-right detailed portion in FIG. 3A, the base plate 302 includes posts 316. The posts 316 allow for one or more components to attach to the base plate 302, as discussed below with respect to FIG. 4.

The ruler device module 300 further includes side plates 326 on opposite sides of, and perpendicular to, the base plate 302 and the top plate 304. Thus, the side plates 326 are generally vertical relative to the generally horizontal base plate 302 and top plate 304. Although described as being separate pieces or elements, the side plates 326 can instead be a perpendicular extension of the top plate 304 or the base plate 302. Each side plate 326 includes one or more guide slots 324. Each guide slot 324 accepts a pin extending from a chassis of a computer system, as discussed below with respect to FIG. 6.

FIG. 3B shows a front side view of the handle structure 310 within the ruler device module 300, according to an embodiment of the present disclosure. The handle structure 310 can include a plurality of apertures 318 on the front surface 310a. The apertures 318 allow airflow to pass through the handle structure 310. The apertures 318 are shown being in the shape of a hexagon. However, the shape of the apertures 318 can be various other shapes, with all of the apertures 318 being the same shape or being different shapes.

FIG. 3C shows a perspective view of the nut structure 314 within ruler device module 300, according to an embodiment of the present disclosure. FIG. 3D shows a front side view of the nut structure 314 within the ruler device module 300, according to an embodiment of the present disclosure. The nut structure 314 includes an aperture 320, such as a threaded aperture, for securing the ruler device module 300 within a chassis of a computing system, as discussed below with respect to FIG. 10.

Similar to the handle structure 310, the nut structure 314 includes apertures 322 on the front surface 314a. The apertures 322 allow airflow to pass through the nut structure 314. The apertures 322 are shown being in the shape of a hexagon. However, the shape of the apertures 322 can be various other shapes, with all of the apertures 322 being the same shape or being different shapes.

Figure 3E:
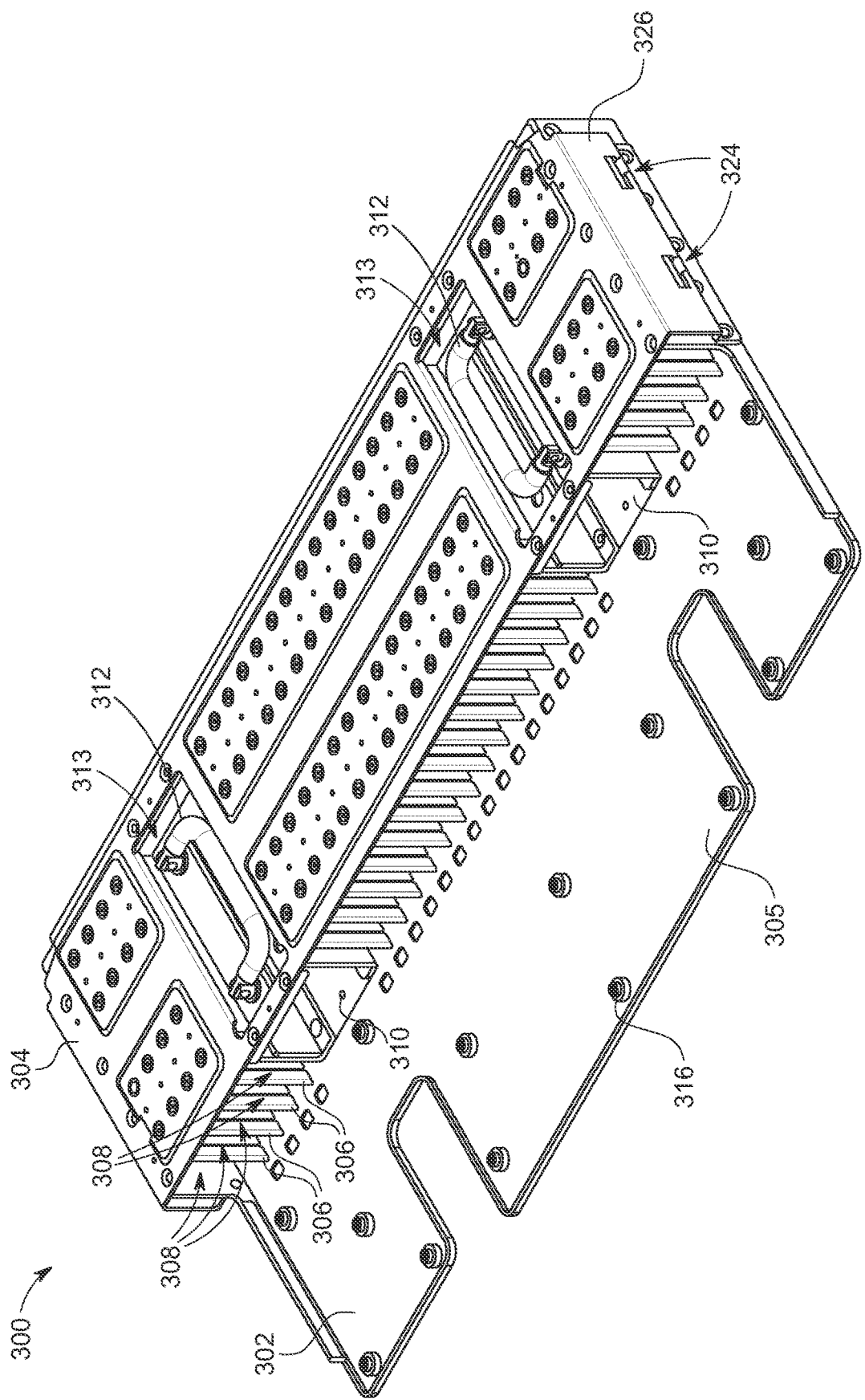
FIG. 3E shows a rear perspective view of a ruler device module, according to an embodiment of the present disclosure.

FIG. 3E shows a rear perspective view of the ruler device module 300, according to an embodiment of the present disclosure. As discussed above, the base plate 302 extends beyond the top plate 304 in at least one direction. FIG. 3E also shows the handle structures 310 are hollow and without a back plate. This allows airflow to pass through the handle structures 310. Alternatively, and as described above, the handle structures 310 can house one or more components, such as fans modules or power supply units.

Figure 4:
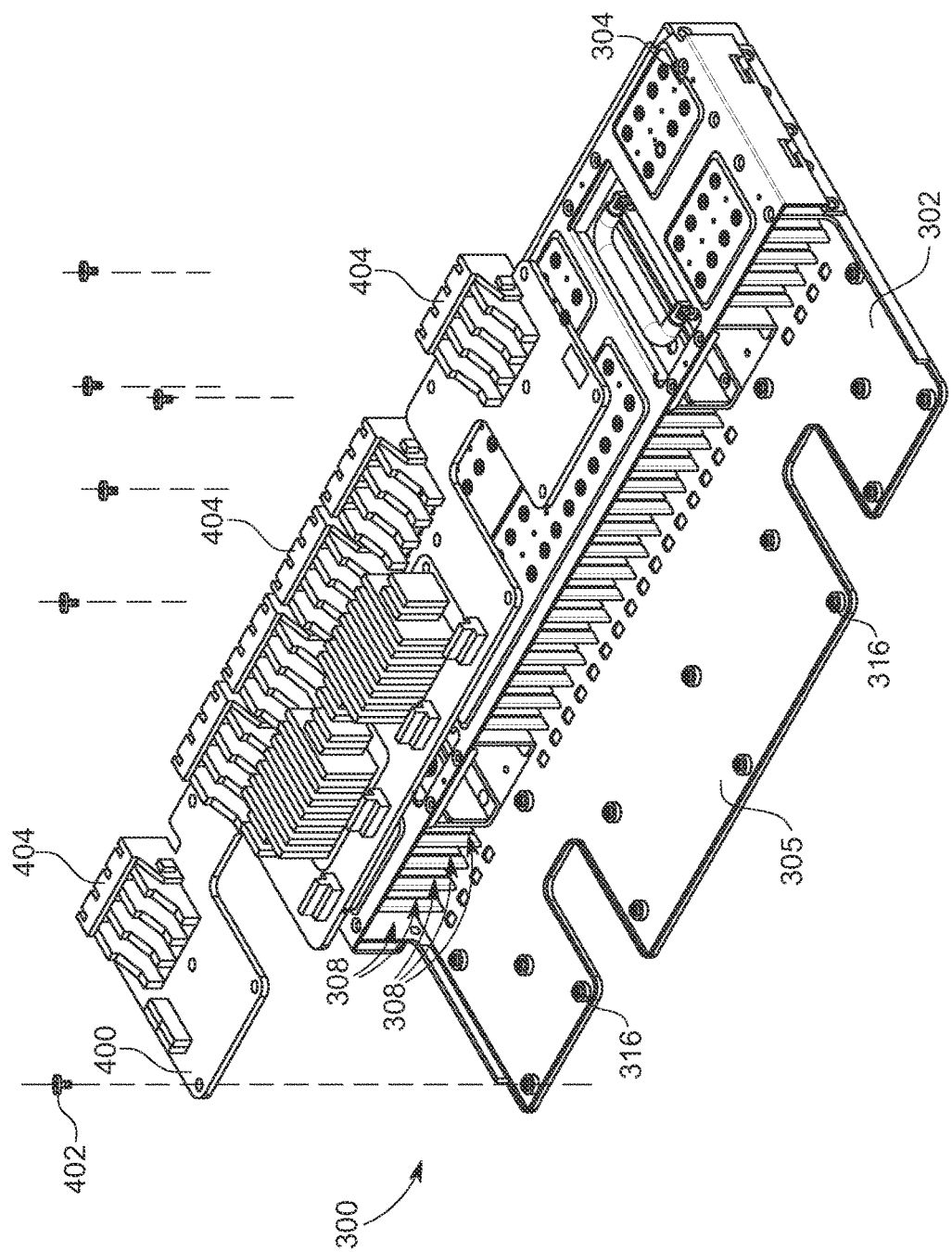
FIG. 4 shows an exploded perspective view of a ruler device module attached to a board of a computing system, according to an embodiment of the present disclosure.
Figure 11:
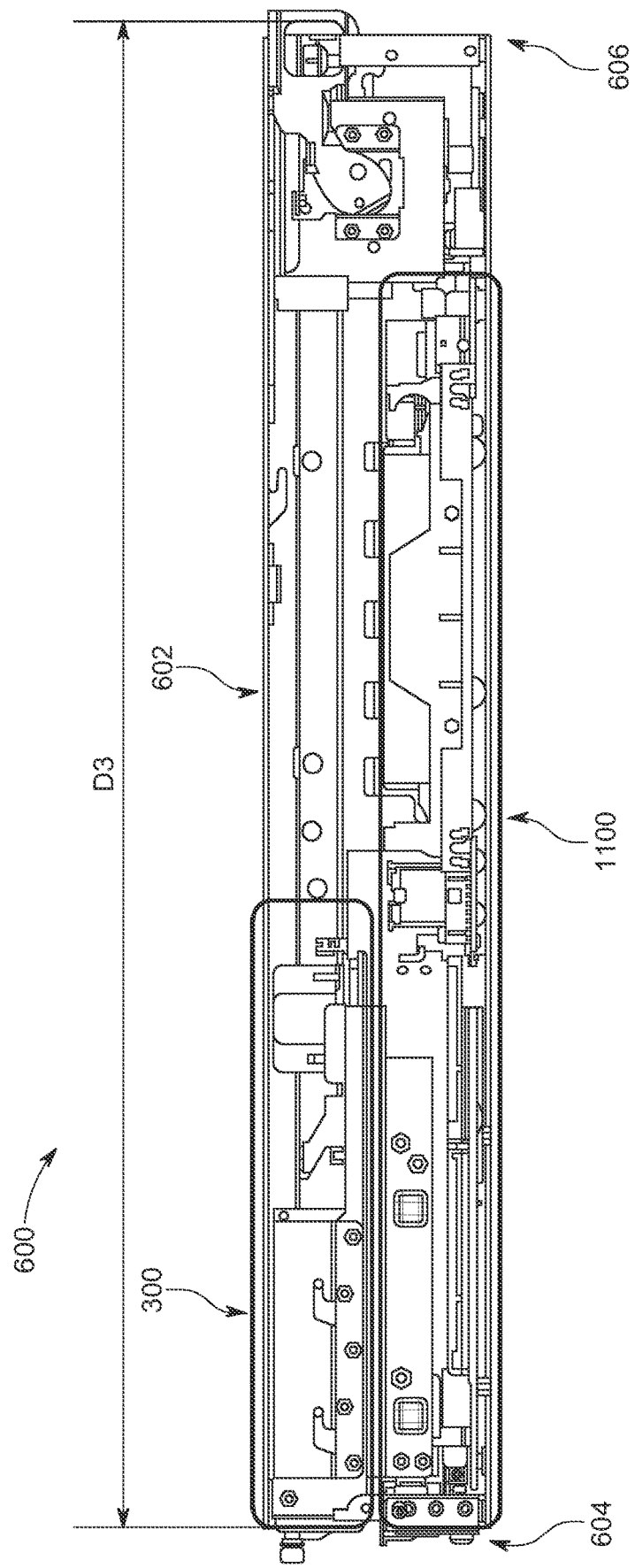
FIG. 11 shows a cross-sectional view of a ruler device module within a computing system, according to an embodiment of the present disclosure.

FIG. 4 shows an exploded perspective view of the ruler device module 300 attached to a board 400 of a computing system (not shown), according to an embodiment of the present disclosure. The board 400 can be a daughter board, or any PCB board, that is configured to connect the ruler device module 300 to a computer system in which the ruler device module 300 is inserted. More specifically, the board 400 includes an interface 404 for the ruler device (FIG. 5) to connect to for connecting the ruler devices (FIG. 5) to the main board of a computing system (FIG. 11). The board 400 rests on the posts 316 and sits on the tray 305 formed by the base plate 302. The specific pattern of the posts 316 can match the required pattern of the board 400. Fasteners 402, such as screws, nails, rivets, etc., secure the board 400 to the posts 316.

Figure 5:
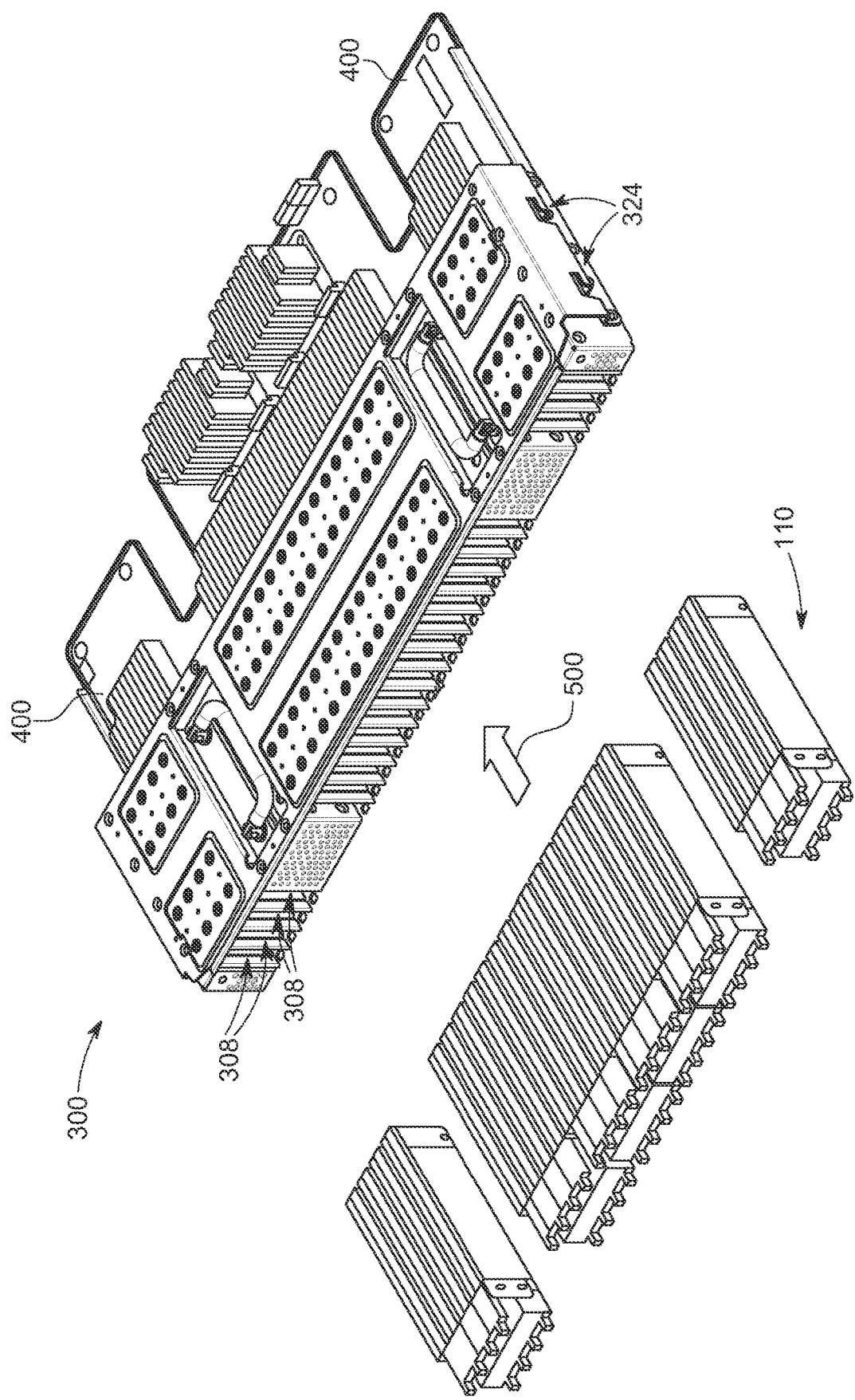
FIG. 5 shows a perspective view of ruler devices inserted into a ruler device module attached to a board of a computing system, according to an embodiment of the present disclosure.

FIG. 5 shows a perspective view of ruler devices 110 being inserted into the ruler device module 300 attached to the board 400, according to an embodiment of the present disclosure. More specifically, FIG. 5 shows 24 ruler devices 110 being inserted into the ruler device module 300, with two groups of four ruler devices 110 and one group of 16 ruler devices 110. Each one of the ruler devices 110 fits within one of the bays 308 in the ruler device module 300. The ruler devices 110 are inserted in the ruler device module 300 in the direction of the arrow 500.

FIG. 6 shows a perspective view of the ruler device module 300 being inserted into a chassis 602 of a computing system 600, according to an embodiment of the present disclosure. The chassis 602 includes a front window 604 and a rear window 606. The ruler device module 300 connected to the board 400 is lowered into the chassis 602 near the front window 604 in the direction of the arrow 608. The chassis 602 includes pins 610 that extend from the sides plates 612 of the chassis 602 near the front window 604. The pins 610 engage the slots 324 in the ruler device module 300 for guiding the ruler device module 300 into the chassis 602, as further described below with respect to the next figures.

Figure 7:
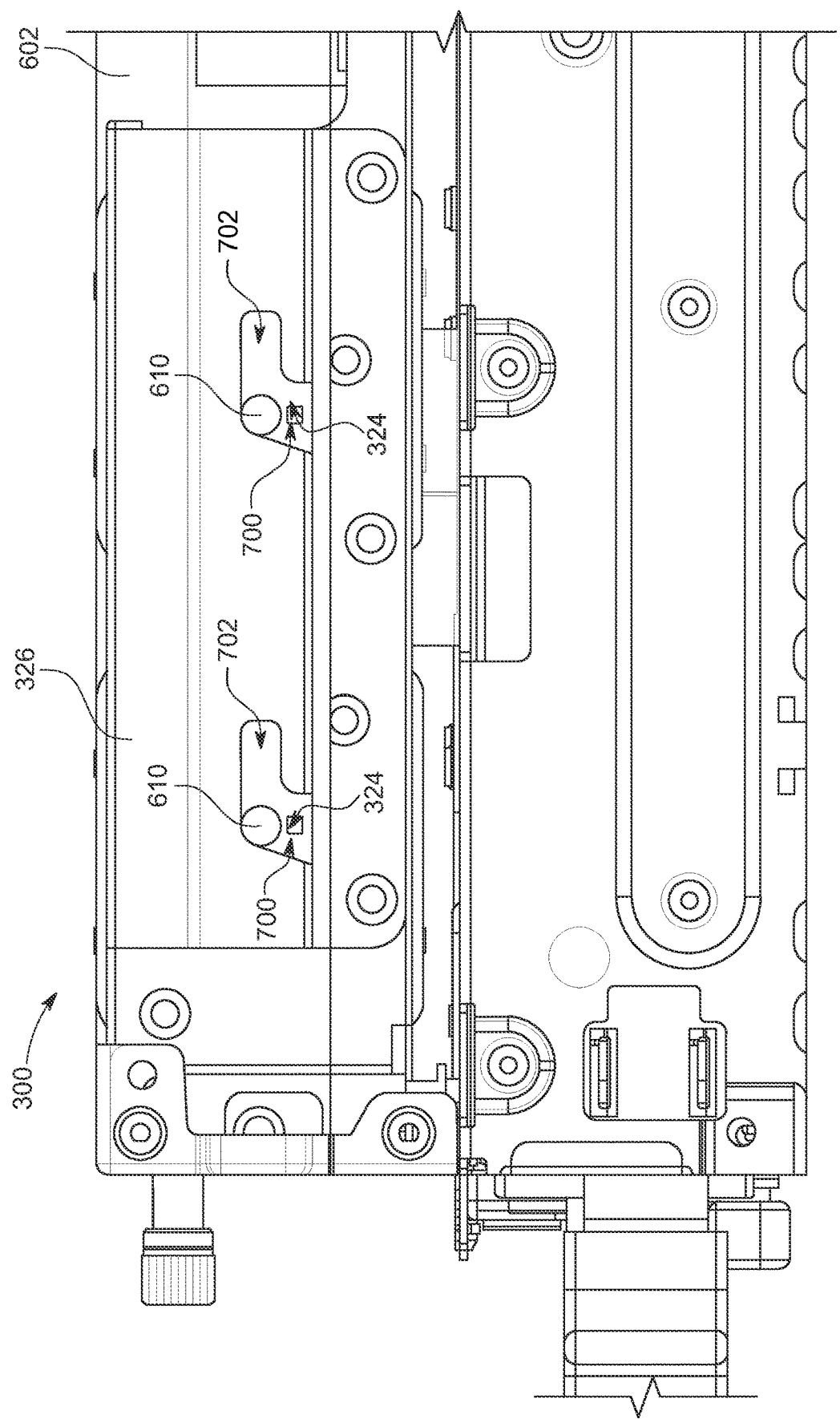
FIG. 7 shows a semi-transparent side-view portion of a ruler device module being inserted into a chassis of a computing system, according to an embodiment of the present disclosure.

Specifically, FIG. 7 shows a semi-transparent side-view portion of the ruler device module 300 being inserted into the chassis 602, according to an embodiment of the present disclosure. Each one of the slots 324 of the ruler device module 300 includes an open portion 700 and a slot portion 702. As the ruler device module 300 is lowered into the chassis 602 according to the direction of arrow 608 in FIG. 6, the pins 610 of the chassis 602 enter the slots 324 through the open portions 700. The pins 610 may then come into contact with the side plates 326, which prevents the ruler device module 300 from being further lowered into the chassis 602.

Figure 8:
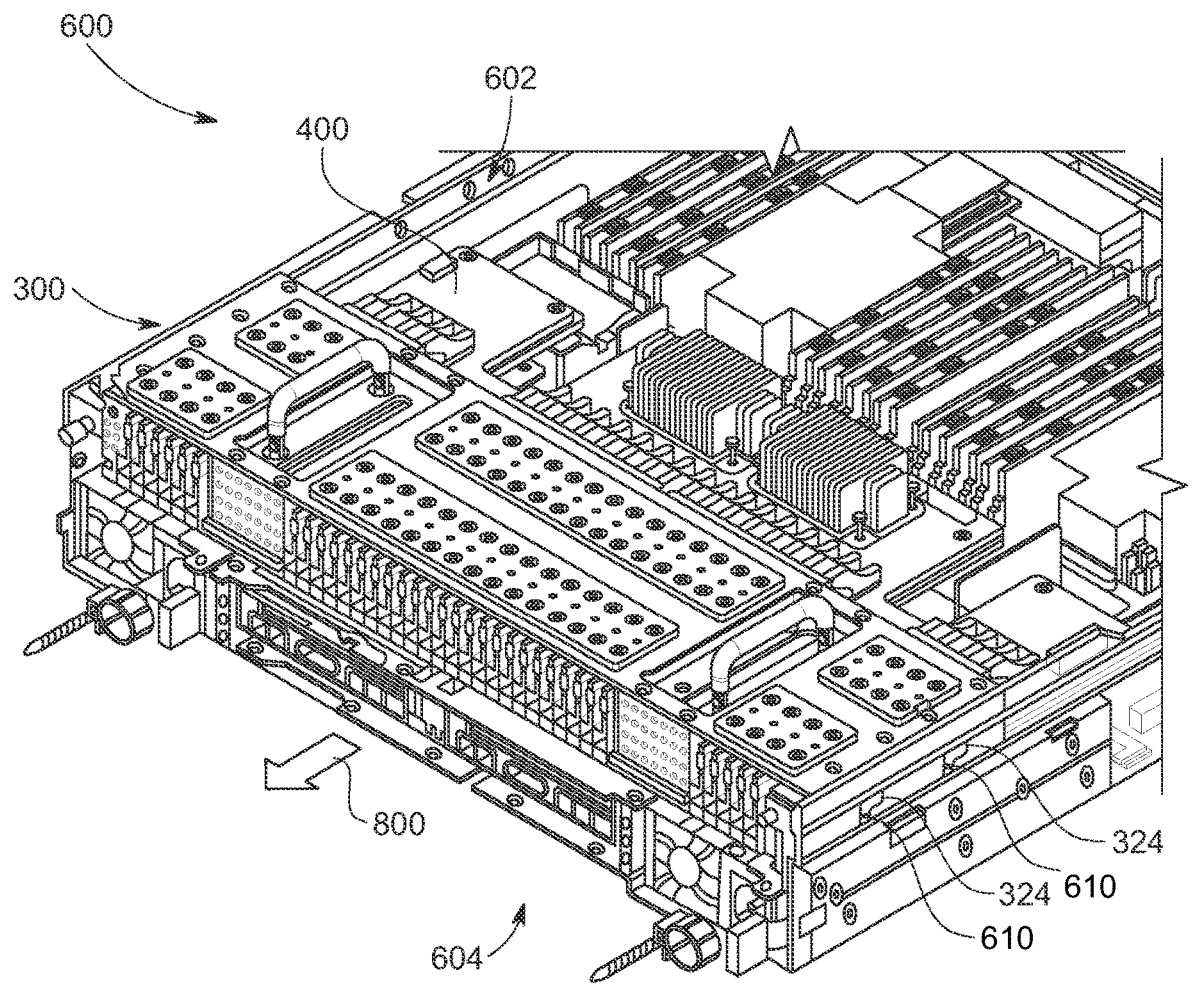
FIG. 8 shows a perspective view of a ruler device module inserted into a chassis of a computing system, according to an embodiment of the present disclosure.

FIG. 8 shows a perspective view of the ruler device module 300 being inserted further into the chassis 602, according to an embodiment of the present disclosure. Once the pins 610 enter the open portions 700 of the slots 324, as shown in FIG. 7, the ruler device module 300 can then be moved in the direction of arrow 800 in FIG. 8, towards the front window 604 of the chassis 602.

Figure 9:
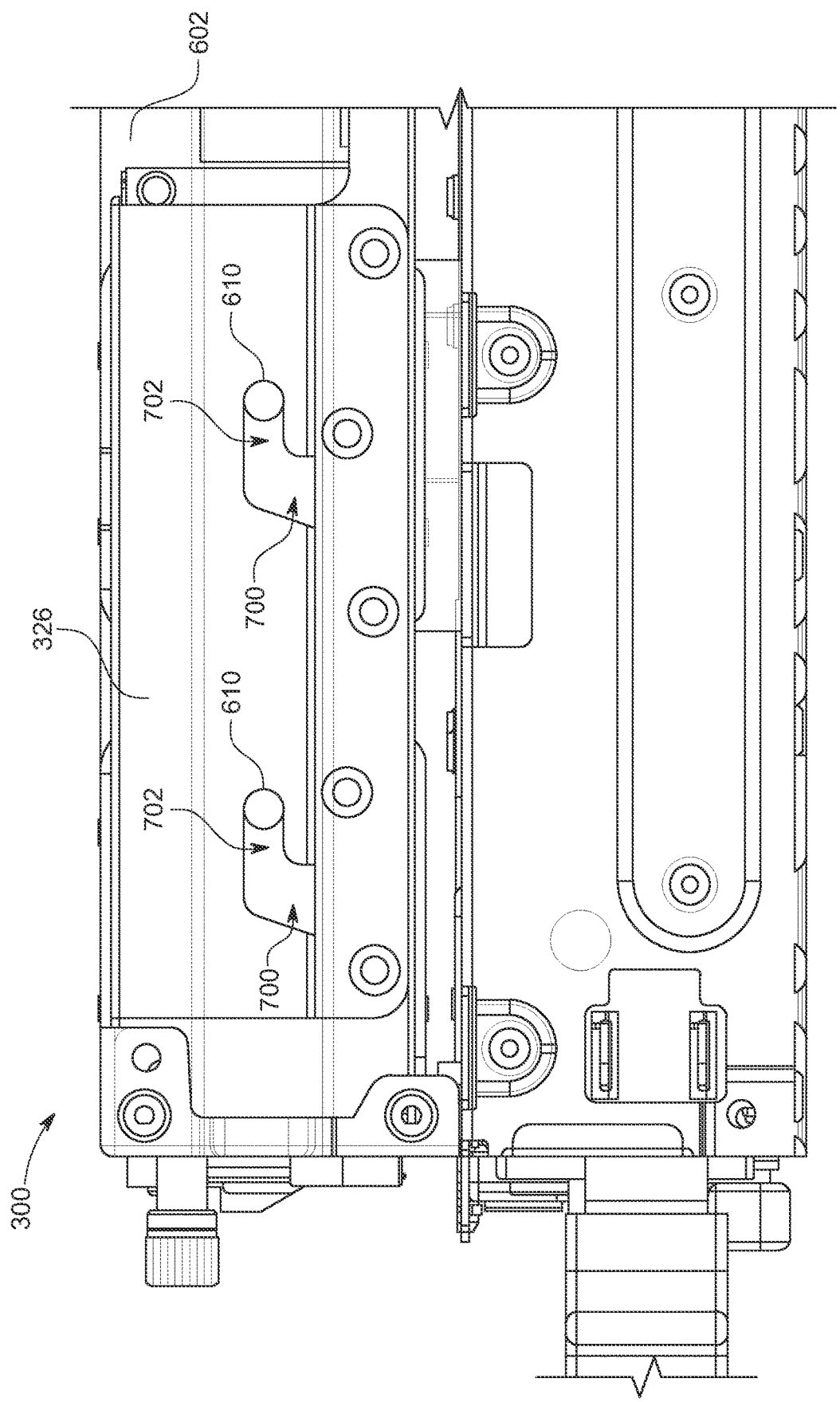
FIG. 9 shows a semi-transparent side-view portion of a ruler device module being engaged with a chassis of a computing system, according to an embodiment of the present disclosure.

FIG. 9 shows a semi-transparent side-view portion of the ruler device module 300 being engaged with the chassis 602, according to an embodiment of the present disclosure. The ruler device module 300 being moved in the direction of arrow 800 in FIG. 8 causes the pins 610 to engage with the slot portions 702 of the slots 324 such that the ruler device module 300 is generally fully engaged with the chassis 602.

FIG. 10 shows a perspective view of the ruler device module 300 being secured to the chassis 602, according to an embodiment of the present disclosure. With the ruler device module 300 generally fully engaged with the chassis 602, fasteners 1000 on the chassis 602 can be secured to the nut structures 314 (FIGS. 3C and 3D) of the ruler device module 300. More specifically, the fasteners 1000 can engage with the apertures 320 (FIGS. 3C and 3D) of the nut structures 314 to secure the ruler device module 300 to the chassis 602. The fasteners 1000 can be various types of fasteners found in computing systems. Preferably, the fasteners 1000 are configured to be operated (e.g., turned) without the need of a tool. Thus, a user can turn the fasteners 1000 by hand to secure and release the ruler device module 300 from the chassis 602. For example, the fasteners 1000 can be thumb screws.

The process of removing the ruler device module 300 from the chassis 602 is the opposite process of the process for assembling the ruler device module 300 in the chassis 602. Although the ruler device module 300 can be removed from the chassis 602, the ruler devices 110 can be removed from the ruler device module 300 with the ruler device module 300 secured within the chassis 602 through the front window 604.

Figure 2:
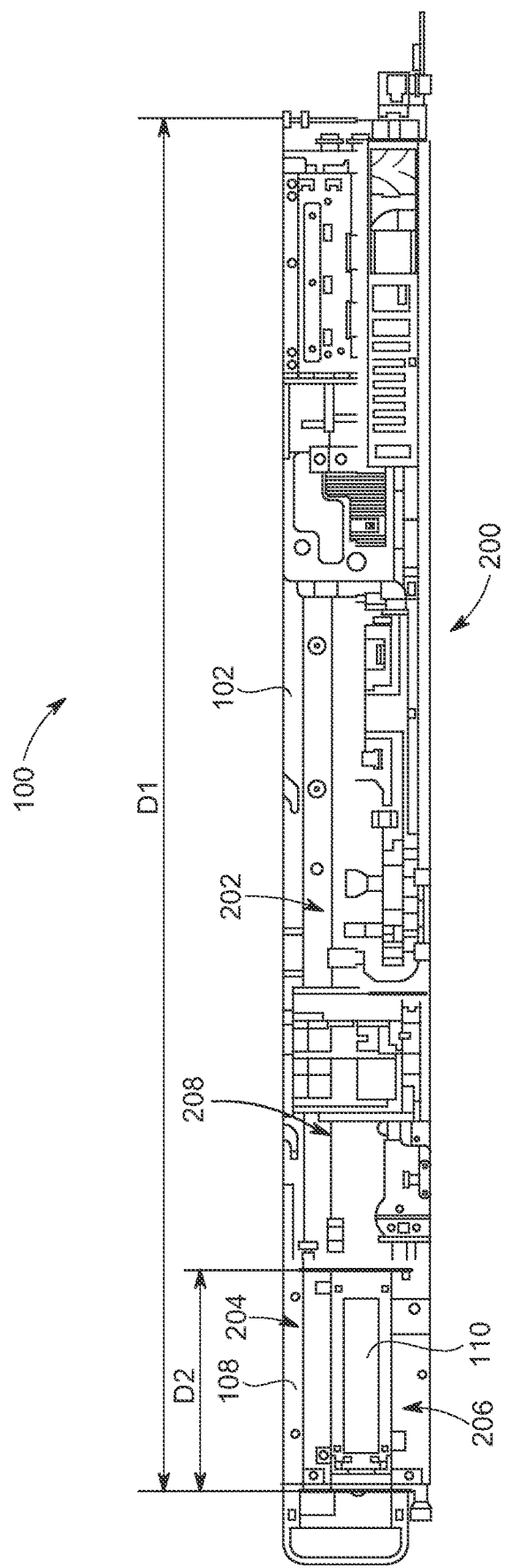
FIG. 2 shows a cross-sectional view of the conventional computing system of FIG. 1.

FIG. 11 shows a cross-sectional view of the ruler device module 300 secured within the chassis 602 of the computing system 600, according to an embodiment of the present disclosure. As shown, the ruler device module 300 is secured at the front window 604 of the chassis 602. The ruler device module 300 is further positioned above the main board 1100 of the computing system 600. This configuration provides for significant space savings. For example, the length D3 of the chassis 602 can be about 580 mm, which is considerably shorter than the length D1 (FIG. 2) of 780 mm for the chassis 102 of the conventional computing system 100 with the ruler device bracket 108 (FIG. 1). This space savings reduces the overall footprint of the computing system 600 and lowers the amount of airflow volume needed through the computing system 600 for cooling, among other benefits. Moreover, the ruler device module 300 can be added to the chassis 602 of the computing system 600 without changing the external dimensions of the chassis 602. In other words, the ruler device module 300 can fit inside the chassis 602 instead of essentially being an extension of the chassis, as is the case for the conventional ruler device bracket 108 for the chassis 102 of the conventional computing system 100 in FIG. 1.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art.

Although the disclosed embodiments have been illustrated and described with respect to one or more embodiments, equivalent alterations and modifications will occur or be known to others skilled in the art upon the reading and understanding of this specification and the annexed drawings. In addition, while a particular feature of the invention may have been disclosed with respect to only one of several embodiments, such feature may be combined with one or more other features of the other embodiments as may be desired and advantageous for any given or particular application.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A ruler device module comprising:
a top plate;
a bottom plate parallel to the top plate and extending beyond the top plate in one direction, the bottom plate defining a tray where the bottom plate extends beyond the top plate;
a pair of side plates on opposite sides of, and extending between, the top plate and the bottom plate, each side plate including a slot;
partitions perpendicular to and between the top plate and the bottom plate forming bays between adjacent partitions and between the top plate and the bottom plate, each bay being configured to retain a ruler device;
a handle structure between the top plate and the bottom plate, the handle structure including a handle configured to rotate between a recessed position, in which the handle is recessed between the top plate and the bottom plate, and a use position, in which the handle extends perpendicular to the top plate; and
a nut structure between the top plate and the bottom plate, the nut structure including a fastener aperture configured to engage a fastener of a chassis to secure the ruler device module to the chassis,
wherein the tray includes a plurality of posts for coupling a board to the tray.

2. The ruler device module of claim 1, wherein the handle structure includes handle airflow apertures configured to permit airflow to pass through the handle structure.

3. The ruler device module of claim 2, wherein the handle airflow apertures are in the shape of a hexagon.

4. The ruler device module of claim 1, wherein the nut structure includes nut airflow apertures configured to permit airflow to pass through the nut structure, and wherein the nut airflow apertures are in the shape of a hexagon.

5. The ruler device module of claim 1, wherein the slot includes an open portion and a slot portion.

6. A computing system comprising:
a chassis including:
two side plates;
a front window and a rear window at opposite ends of the two side plates;
two pins, with each pin extending from a separate one of the two side plates and at the front window; and
a fastener;
a main board housed within the chassis;
a ruler device module including:
a top plate;
a bottom plate parallel to the top plate and extending beyond the top plate in one direction, the bottom plate defining a tray where the bottom plate extends beyond the top plate;
a pair of side plates on opposite sides of, and extending between, the top plate and the bottom plate, each side plate including a slot that is configured to engage with one of the two pins;
partitions perpendicular to and between the top plate and the bottom plate forming bays between adjacent partitions and between the top plate and the bottom plate, each bay being configured to retain a ruler device; and
a handle structure recessed within the top plate, the handle structure including a handle configured to rotate between a recessed position, in which the handle is recessed within the top plate, and a use position, in which the handle extends perpendicular to the top plate, for removing and inserting the ruler device module from the chassis; and
a daughter board coupled to the ruler device on the tray, the daughter board configured to connect the ruler device module to the main board,
wherein the tray includes a plurality of posts upon which the daughter board sits for coupling the daughter board to the tray.

7. The computing system of claim 6, wherein the handle structure includes airflow apertures configured to permit airflow to pass through the handle structure.

8. The computing system of claim 6, wherein the ruler device includes a nut structure including a fastener aperture configured to engage the fastener to secure the ruler device module to the chassis, and wherein the nut structure includes airflow apertures configured to permit airflow to pass through the nut structure.

9. The computing system of claim 6, wherein the fastener is a thumb screw.

10. The computing system of claim 6, wherein the ruler device module overlaps the main board within the chassis.

11. The computing system of claim 6, wherein the slot includes an open portion and a slot portion, and the pins sit in the slot portions with the ruler device secured to the chassis.

12. The computing system of claim 11, wherein the open portion faces the chassis so that the ruler device module can be lowered into the chassis to place the ruler device module into the chassis.

13. The computing system of claim 6, wherein the handle structure is recessed between the top plate and the bottom plate.

14. The computing system of claim 6, wherein the ruler device includes a nut structure including a fastener aperture configured to engage the fastener to secure the ruler device module to the chassis, and wherein the nut structure is between the top plate and the bottom plate.

15. The computing system of claim 14, wherein the nut structure includes a first nut structure at one side of the top plate and the bottom plate, the nut structure including a second nut structure at an opposing side of the top plate and the bottom plate, the first and second nut structures being adjacent to the pair of side plates, and the fastener includes a first fastener and a second fastener.

16. The computing system of claim 6, wherein the ruler device module fits recessed within the chassis.

17. The computing system of claim 16, wherein the chassis is 580 mm long.

\* \* \* \* \*